US012758988B2

(12) United States Patent
Patel H B et al.

(10) Patent No.: US 12,758,988 B2
(45) Date of Patent: Oct. 13, 2026

(54) SHOWERHEAD HEATED BY CIRCULAR ARRAY

(71) Applicant: Applied Materials, Inc., Santa Clara, CA (US)

(72) Inventors: Shashidhara Patel H B, Bangalore (IN); Muhannad Mustafa, Milpitas, CA (US); Amit Sahu, Bangalore (IN); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 572 days.

(21) Appl. No.: 18/207,457

(22) Filed: Jun. 8, 2023

(65) Prior Publication Data

US 2024/0408621 A1 Dec. 12, 2024

(51) Int. Cl.

| | |
|---|---|
| ***B05B 1/00*** | (2006.01) |
| ***B05B 1/24*** | (2006.01) |
| ***H01L 21/02*** | (2006.01) |
| ***H10P 14/20*** | (2026.01) |

(52) U.S. Cl.

CPC ................ *B05B 1/005* (2013.01); *B05B 1/24* (2013.01); *H10P 14/3411* (2026.01); *H10P 14/3454* (2026.01)

(58) Field of Classification Search

None

See application file for complete search history.

(56) References Cited

U.S. PATENT DOCUMENTS

| | | | | |
|---|---|---|---|---|
| 6,019,848 | A * | 2/2000 | Frankel | C23C 16/455 118/715 |
| 6,056,823 | A * | 5/2000 | Sajoto | C23C 16/4401 118/715 |
| 6,063,199 | A * | 5/2000 | Sajoto | C23C 16/4409 118/715 |
| 6,258,170 | B1 * | 7/2001 | Somekh | C23C 16/45561 392/394 |
| 6,364,954 | B2 * | 4/2002 | Umotoy | C23C 16/4584 118/728 |
| 6,453,992 | B1 | 9/2002 | Kim et al. | |
| 6,527,865 | B1 * | 3/2003 | Sajoto | H01L 21/6715 118/724 |
| 9,121,097 | B2 * | 9/2015 | Mohn | C23C 16/45589 |
| 9,343,274 | B2 * | 5/2016 | Rasheed | H01J 19/54 |
| 10,535,502 | B2 * | 1/2020 | Carducci | H01J 37/3244 |
| 10,600,624 | B2 * | 3/2020 | Ghosh | H01J 37/32834 |
| 11,447,866 | B2 * | 9/2022 | Mustafa | C23C 16/45565 |
| 11,502,217 | B1 * | 11/2022 | Ganguly | H01J 37/3244 |
| 11,598,003 | B2 * | 3/2023 | Gungor | C23C 16/46 |
| 11,732,358 | B2 * | 8/2023 | Mustafa | C23C 16/50 118/715 |

(Continued)

OTHER PUBLICATIONS

"PCT International Search Report and Written Opinion in PCT/US2024/032928 dated Oct. 2, 2024, 11 pages".

*Primary Examiner* — Jethro M. Pence
(74) *Attorney, Agent, or Firm* — SERVILLA WHITNEY LLC

(57) ABSTRACT

Process chamber lids, processing chambers and methods using the lids are described. In some embodiments, the lid includes a showerhead with a plurality of heater segments in a peripheral region thereof. The heated showerhead minimizes temperature non-uniformity and/or minimizes heat less near the peripheral edge of a processed wafer.

15 Claims, 4 Drawing Sheets

(56) References Cited

U.S. PATENT DOCUMENTS

| | | | | |
|---|---|---|---|---|
| 2005/0109276 | A1* | 5/2005 | Iyer | C23C 16/45565<br>427/248.1 |
| 2006/0102076 | A1* | 5/2006 | Smith | C23C 16/45565<br>427/248.1 |
| 2006/0137607 | A1 | 6/2006 | Seo et al. | |
| 2009/0095219 | A1 | 4/2009 | Meinhold et al. | |
| 2014/0061324 | A1 | 3/2014 | Mohn et al. | |
| 2014/0087561 | A1* | 3/2014 | Lee | C23C 16/45517<br>438/689 |
| 2014/0209027 | A1* | 7/2014 | Lubomirsky | H01J 37/3244<br>118/724 |
| 2017/0088949 | A1* | 3/2017 | Babayan | H01L 21/67109 |
| 2018/0073142 | A9* | 3/2018 | Janakiraman | C23C 16/4412 |
| 2018/0347043 | A1* | 12/2018 | Yuan | C23C 16/45561 |
| 2019/0078210 | A1 | 3/2019 | Gungor et al. | |
| 2020/0051789 | A1 | 2/2020 | Linebarger, Jr. et al. | |
| 2020/0385862 | A1* | 12/2020 | Srivastava | C23C 16/45536 |
| 2021/0395892 | A1 | 12/2021 | Mustafa et al. | |
| 2022/0102114 | A1 | 3/2022 | Ohashi et al. | |
| 2022/0376130 | A1 | 11/2022 | Ganguly | |
| 2023/0323531 | A1* | 10/2023 | Behnke | C23C 16/4404 |
| 2024/0209500 | A1* | 6/2024 | Cen | C23C 16/54 |
| 2024/0222128 | A1* | 7/2024 | Zhao | H01L 21/76879 |
| 2024/0240322 | A1* | 7/2024 | Chowdhury | C23C 16/4401 |
| 2025/0118572 | A1* | 4/2025 | McHugh | H01L 21/67248 |

* cited by examiner

SHOWERHEAD HEATED BY CIRCULAR ARRAY

TECHNICAL FIELD

Embodiments of the disclosure generally relate to lids for semiconductor manufacturing processing chambers. In particular, embodiments of the disclosure relate to processing chamber lids with heater showerheads. In some embodiments, the showerheads are heater by a circular array of heaters.

BACKGROUND

During processing, a wafer is typically heated from below by a heater within a substrate support. As the wafers and supports are traditionally circular, the heater is often positioned near the center of the support and wafer. Given the low pressure processing environment and the gas flows onto and across the wafer surface during processing, the temperature of the wafer is often below that of the substrate support.

Provided the increased gas and vacuum flows near the edge of the wafer and aggravated by its relative distance from the effect of the heater, the temperature near the edge of the wafer is lower than near the center of the wafer. Existing temperature non-uniformity (NU) is about 3-4° C. across a substrate.

Several processing methods used in semiconductor manufacturing are known to be highly temperature sensitive. Specifically, amorphous silicon deposition is a highly temperature sensitive process, and a temperature NU of 3-4 degrees results in wafer NU 3Sigma <4-6%. This does not meet increasingly stringent manufacturing requirements.

While advances continue to be made in substrate support heater technologies, existing technologies often produce a higher temperature near the center of the wafer which decreases near the peripheral edge.

Further, since most deposition apparatus contains a slit valve to transport wafers into and out of the apparatus or a single exhaust port, the temperature loss near these openings may be particularly pronounced and affect temperature NU and resulting film quality.

Accordingly, there is need for processing apparatus that decreases temperature NU and enables deposition processes which require low temperature NU.

SUMMARY

One or more embodiments of the disclosure are directed to a process chamber lid comprising a lid plate, a showerhead, a showerhead heater and a gas funnel. The lid plate comprises a body having an inner wall, an outer wall, a top wall and a bottom wall. The inner wall extends around a central axis spaced a first distance from the central axis forming an open central region. The showerhead is positioned within the open central region and has a front surface and a back surface defining a thickness with a plurality of apertures extending through the thickness. The gas funnel is positioned above the showerhead and has a front surface, a back surface, an outer wall and an inner wall. The gas funnel has an opening extending through the back surface to the front surface. The showerhead heater is positioned on the back surface of the showerhead.

Additional embodiments of the disclosure are directed to a processing method comprising heating a substrate with a substrate support heater positioned below the substrate; heating at least a portion of a peripheral region of a showerhead positioned above the substrate with at least one of a plurality of individually controlled heater segments on the showerhead; and minimizing temperature non-uniformity of the substrate by controlling the substrate support heater and at least one of the individually controlled heaters.

Further embodiments of the disclosure are directed to a method of minimizing substrate heat loss. The method comprises positioning a substrate on a substrate support in a process region opposite a showerhead. The substrate is heated with a substrate heater within the substrate support and near a center of the substrate support. The process region is evacuated to lower a temperature of the substrate in a peripheral region of the substrate. The peripheral region of the substrate is heated by heating the showerhead with a heater in a peripheral region of the showerhead.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
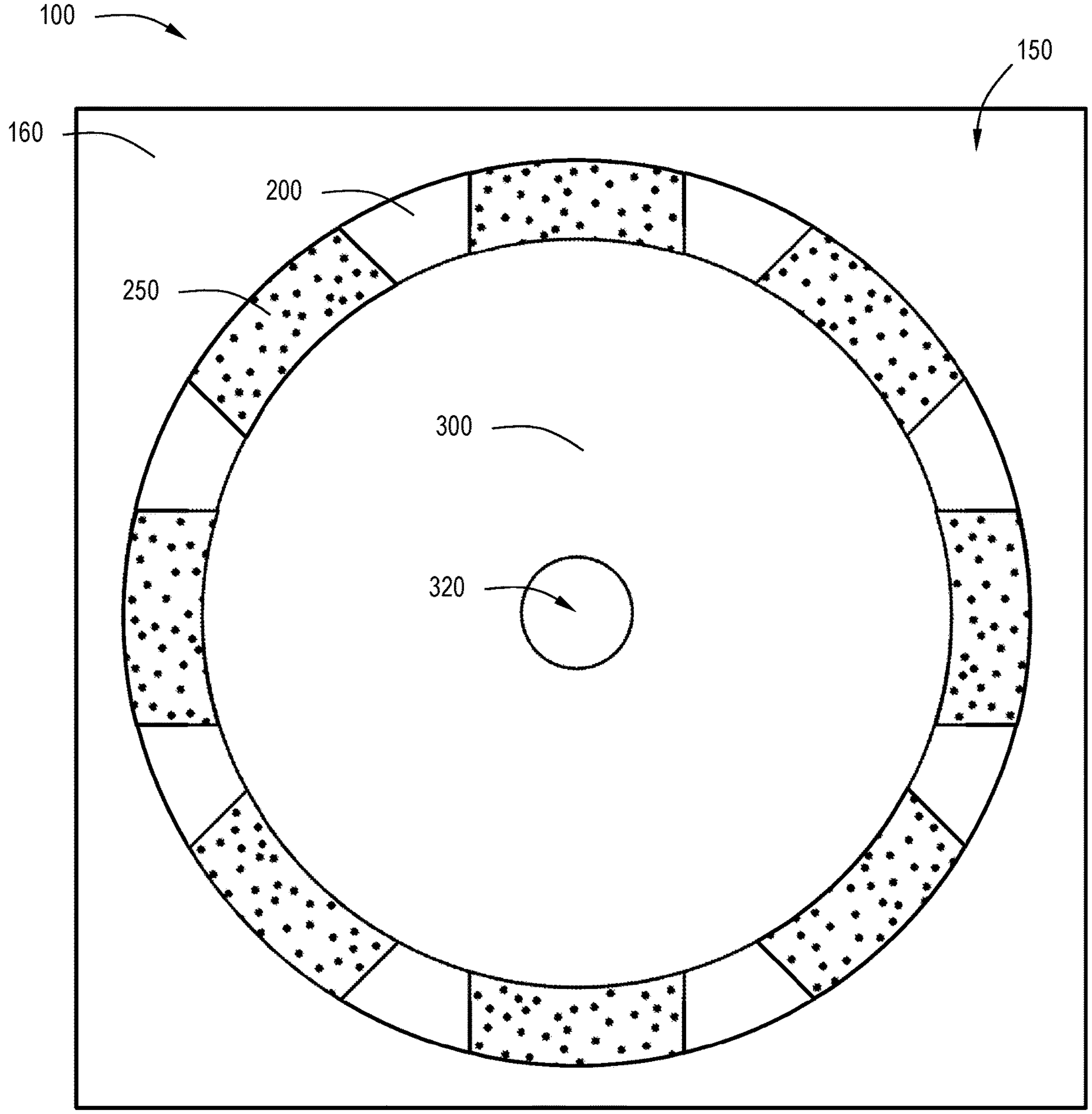
FIG. 1 shows a top view of a process chamber lid in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure are directed to deposition chamber lids designed for reducing temperature non-uniformity across a processed wafer. Some embodiments advantageously provide a chamber lid with a plurality of showerhead heaters for increased temperature control of processed wafers. In some embodiments, the showerhead heaters are individually controlled to adjust for non-uniform chamber features which affect heat flow and wafer temperature.

Some embodiments incorporate dual lid seals to enable high temperature dispensing up to 250° C. Some embodiments incorporate thick showerheads and blocker plates designed to avoid warpage during high temperature processes as well as to ensure uniform temperature distribution.

One or more embodiments of the disclosure are directed to deposition chamber lids incorporating heaters to directly heat the showerhead and reduce heat loss from the wafer. In some embodiments, the heaters are positioned near the peripheral edge of the showerhead to heat the outer diameter.

In some embodiments, a plurality of heater segments are mounted on the showerhead. In some embodiments, each heater segment is rated for 400 W. In some embodiments, each heater segment is independently controllable.

In some embodiments, the chamber lids are mounted on a deposition chamber. In some embodiments, the deposition chamber includes a slit valve for placing wafers within the chamber. In some embodiments, the deposition chamber includes an exhaust port for removing process gasses from the chamber.

Figure 2:
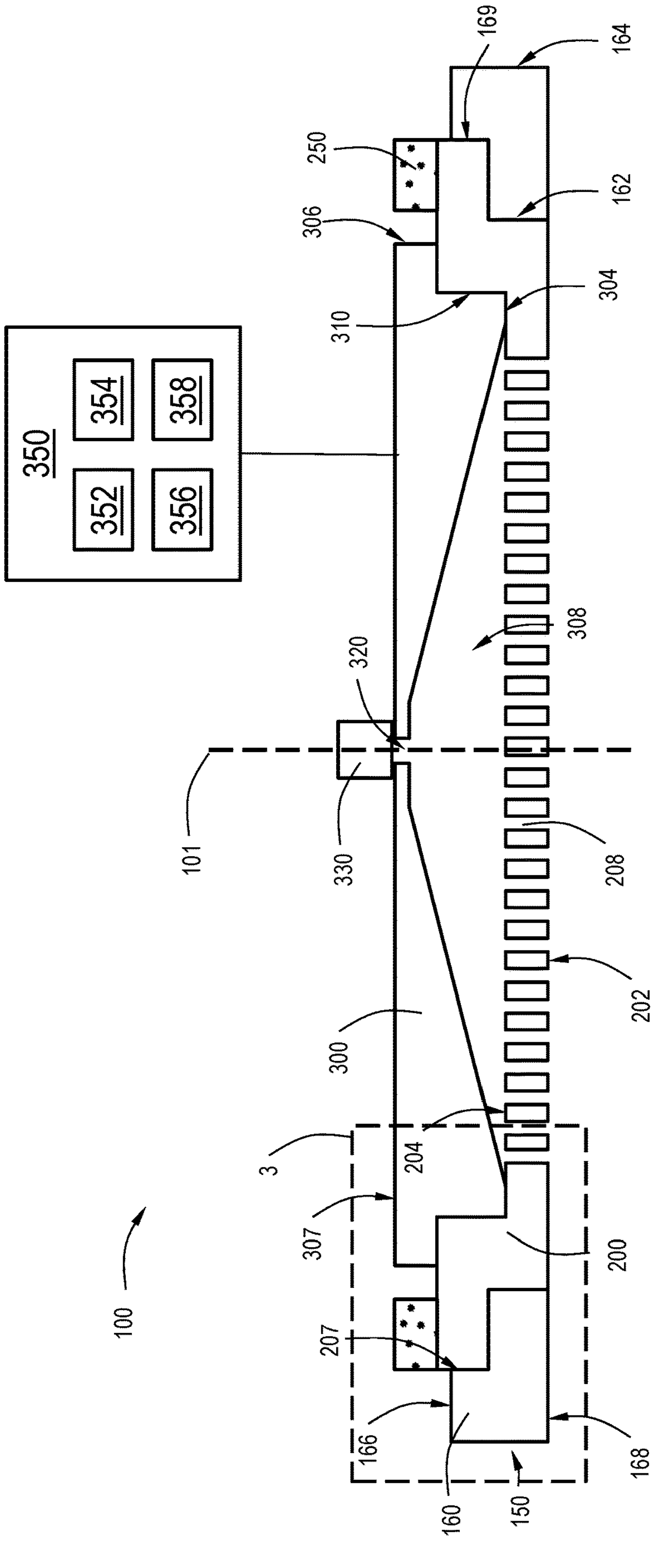
FIG. 2 shows a cross-sectional view of process chamber lid in accordance with one or more embodiment of the disclosure.

Accordingly, one or more embodiments of the disclosure are directed to process chamber lid 100. FIG. 1 illustrates a top view of a process chamber lid 100 according to one or more embodiment of the disclosure. FIG. 2 illustrates a cross-sectional view of the process chamber lid 100 shown in FIG. 1 taken along line 2-2'. The various shading (if any) shown in the Figures is for descriptive purposes only to aid in identification of parts and does not imply any particular material of construction. The process chamber lid 100 includes a lid plate 150, a showerhead 200, a gas funnel 300, and a showerhead heater 250 as described herein.

The lid plate 150 has a body 160 with any suitable shape. In some embodiments, as shown in FIG. 1, the body 160 has a generally square body. However, the skilled artisan will recognize that the lid plate 150 can have any suitable shape depending on, for example, the process chamber on which the chamber lid will be used.

The body 160 of the lid plate 150 has an inner wall 162, an outer wall 164, a top wall 166 and a bottom wall 168. The inner wall 162 has an inner face that extends around the central axis 101 of the body 160 and is spaced a distance from the central axis 101.

While not shown in the Figures, in some embodiments, the outer wall 164 of an upper portion is further from the central axis 101 than the outer wall 164 of a lower portion.

A showerhead 200 is positioned in an open central region of the lid plate 150. The showerhead 200 has a front surface 202 and a back surface 204 defining a thickness of the showerhead 200, and an outer wall 207. A plurality of apertures 208 extend through the thickness of the showerhead 200 and have openings in the front surface 202 and the back surface 204. The showerhead 200 can be any suitable showerhead known to the skilled artisan with any suitable number of apertures 208 arranged in any suitable configuration.

In some embodiments, the outer wall 207 has an outer face 210 and an inner face 212. The outer face 210 of the outer wall 207 contacts the inner wall 162 of the lid plate 150.

The gas funnel 300 is positioned within the central region of the showerhead 200. The gas funnel 300 has a front surface 304, sidewalls 306 and a back surface 307. The sidewalls 306 have an outer face 310. The outer face 310 of the sidewalls 306 contact the inner face 212 of the showerhead 200.

The front surface 304 of some embodiments is spaced a distance $D_F$ from the back surface 204 of the showerhead 200 to form a funnel gap 308. In some embodiments, the funnel gap 308 has a uniform dimension from edge to edge of the gas funnel 300. In some embodiments, as shown in FIG. 2, the front surface 304 of the gas funnel 300 has an inverted funnel-like shape with a larger funnel gap 308 adjacent the central axis 101 of the gas funnel 300 than adjacent the front surface 304 near the outer peripheral region.

The gas funnel 300 has an opening 320 extending through the back surface 307 to the front surface 304. The opening 320 of some embodiments is symmetrical around a central axis of the gas funnel 300 and/or the central axis 101 of the chamber lid 100. In some embodiments, the opening 320 is adjacent the front surface 304 flares from a first diameter at the back surface 307 to a second diameter larger than the first diameter at the front surface 304. The diameter of the opening 320 of some embodiments remains substantially uniform (within +0.1 mm) from the back surface 307 to a depth within the gas funnel 300 and then flares from the depth within the gas funnel 300 to the second diameter at the front surface 304, as illustrated in FIG. 2.

The process chamber lid 100 includes a showerhead heater 250. The showerhead heater 250 is positioned on the back surface 204 of the showerhead 200. In some embodiments, the showerhead heater 250 comprises a plurality of separate segments spaced around the back surface 204 of the showerhead 200. The embodiment illustrated in the Figures has eight showerhead heater 250 segments. In some embodiments, there are two, three, four, five, six, seven or eight separate showerhead heater 250 segments. In some embodiments, the showerhead heater 250 segments are evenly spaced around the back surface 204 of the showerhead 200. In some embodiments, the showerhead heater 250 segments are arrayed in a circular pattern around the central axis 101. In some embodiments, the showerhead heater 250 segments are positioned near the outer peripheral edge of the showerhead 200.

In some embodiments, all of the showerhead heater 250 segments are controlled in unison. In some embodiments, each of the segments is independently controlled.

In some embodiments, the showerhead heater 250 segments are separated by another component of the process chamber lid 100. In some embodiments, not shown, the showerhead heater 250 segments are separated from adjacent segments by an eye bolt or other connection means for connecting the showerhead 200 to the lid plate 150.

Figure 3:
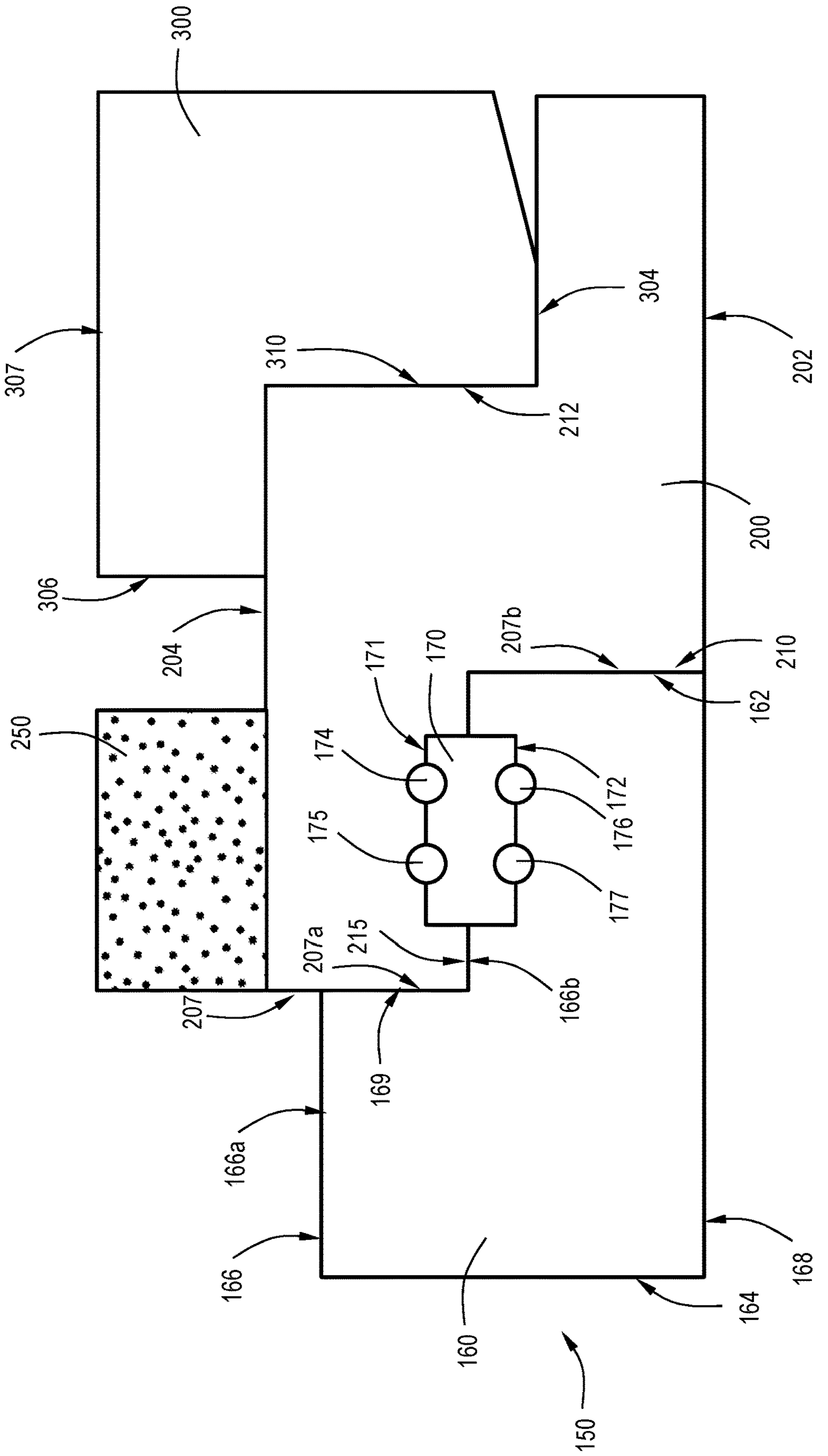
FIG. 3 is an expanded view of region 3 of FIG. 2.

FIG. 3 shows an expanded view of region 2 illustrated in FIG. 2. With reference to FIGS. 2 and 3, in some embodiments, the lid plate 150 comprises an outer top wall 166*a* and an inner top wall 166*b* that form an inner ledge. The inner ledge has a ledge surface 169 connecting the inner top wall 166*b* and the outer top wall 166*a*.

In some embodiments, as shown in the Figures, the outer wall 207 of the showerhead 200 comprises a lower outer wall 207*b* and an upper outer wall 207*a*. The upper outer wall 207*a* extends further from the central axis 101 than the lower outer wall 207*b*. The lower outer wall 207*b* and the upper outer wall 207*a* are connected by a cantilever surface 215. In some embodiments, the cantilever surface 215 of the showerhead 200 is positioned over the inner top wall 166*b* of the lid plate 150. In some embodiments, the cantilever surface 215 of the showerhead 200 is directly over the inner top wall 166*b* of the lid plate 150. As used in this manner, the term "directly over" means that there are no intervening components other than O-rings separating the recited parts.

In some embodiments, the cantilever surface 215 is over the inner top wall 166*b* and spaced from the inner top wall 166*b* by a spacer ring 170. The spacer ring 170 has a top surface 171 and a bottom surface 172 defining a thickness of the spacer ring 170. The spacer ring 170 of some embodiments is positioned between the cantilever surface 215 of the showerhead 200 and the inner top wall 166*b* of the lid plate 150 so that the cantilever surface 215 is adjacent the top surface 171 of the spacer ring 170 and the inner top wall 166*b* is adjacent the bottom surface 172 of the spacer ring 170. In some embodiments, the spacer ring 170 is positioned directly between the cantilever surface 215 of the showerhead 200 and the inner top wall 166*b* of the lid plate 150 so that the cantilever surface 215 is adjacent the top surface 171 of the spacer ring 170 and the inner top wall 166*b* is adjacent the bottom surface 172 of the spacer ring 170. As used in this manner the term "directly between" means that there no intervening components other than O-rings between the recited components.

In some embodiments, an inner top surface O-ring 174 and an outer top surface O-ring 175 are positioned between and in direct contact with the top surface 171 of the spacer ring 170 and the cantilever surface 215 of the showerhead 200. In some embodiments, an inner bottom surface O-ring 176 and an outer bottom surface O-ring 177 are positioned between and in direct contact with the bottom surface 172 of the spacer ring 170 and the inner top wall 166*b* of the lid plate 150.

While not shown in the Figures, it is also envisioned that the showerhead 200 and the gas funnel 300 may also be paired in the same fashion as the lid plate 150 and the showerhead 200 described above with respect to the inner top wall 166*b*, cantilever surface 215, and/or spacer ring 170.

Referring to FIG. 2, some embodiments further comprise a gas inlet 330 connected to, or directly connected to, the back surface 307 of the gas funnel 300. As used in this manner, the gas inlet 330 comprises one or more components configured to provide a flow of gas to the gas funnel 300. The gas inlet 330 provides fluid communication between a gas source and the opening 320 in the front surface 304 of the gas funnel 300. The gas inlet 330 of some embodiments is connected to gas source for providing a process gas through the gas inlet 330, the gas funnel 300 and the showerhead 200.

Referring back to FIG. 2, some embodiments include a controller 350 coupled to various components of the process chamber lid 100 to control the operation thereof. The controller 350 of some embodiments controls the entire processing chamber (described in part below with respect to FIG. 4). In some embodiments, the processing chamber includes multiple controllers, of which controller 350 is a part; each controller configured to control one or more individual portions of the processing chamber.

In some embodiments, at least one controller 350 is coupled to one or more of the process chamber lid 100, showerhead heater 250, one or more flow controller, pressure gauge, pump, feedback circuit, plasma source, purge ring, other thermal element, or other component used for the operation of the processing chamber or process chamber lid 100, as the skilled artisan will understand.

The controller 350 may be one of any form of general-purpose computer processor, microcontroller, microprocessor, etc., that can be used in an industrial setting for controlling various chambers and sub-processors. The at least one controller 350 of some embodiments has a processor 352, a memory 354 coupled to the processor 352, input/output devices 356 coupled to the processor 352, and support circuits 358 to communicate between the different electronic components. The memory 354 of some embodiments includes one or more of transitory memory (e.g., random access memory) and non-transitory memory (e.g., storage).

The memory 354, or a computer-readable medium, of the processor may be one or more of readily available memory such as random access memory (RAM), read-only memory (ROM), floppy disk, hard disk, or any other form of digital storage, local or remote. The memory 354 can retain an instruction set that is operable by the processor 352 to control parameters and components of the system. The support circuits 358 are coupled to the processor 352 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Figure 4:
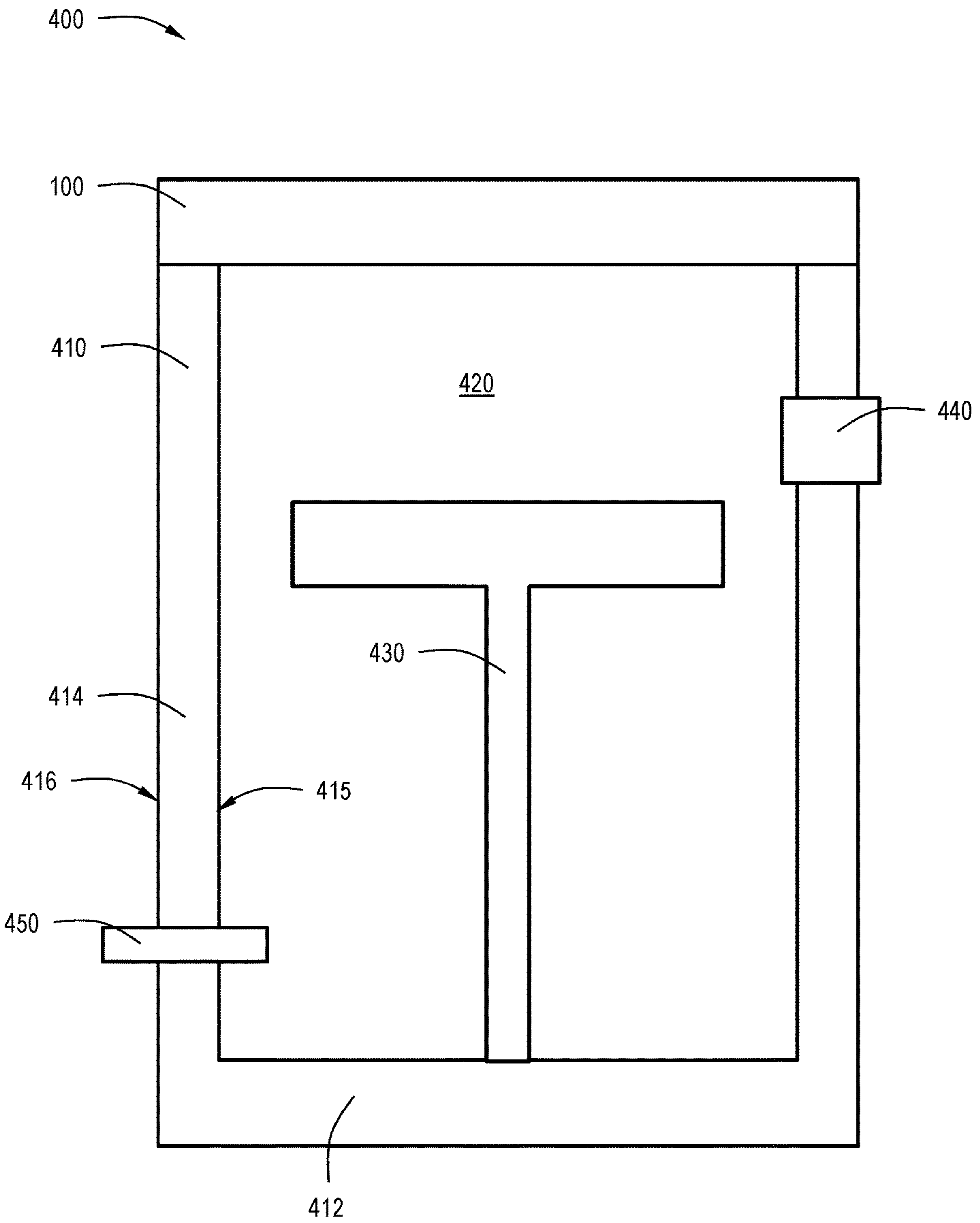
FIG. 4 is a cross-sectional view of a process chamber according to one or more embodiment of the disclosure.

Referring to FIG. 4, a process chamber 400 is illustrated comprising a process chamber lid 100 according to one or more embodiment of the disclosure. The process chamber comprises a chamber body 410 comprising a bottom 412 and a sidewall 414 between an inner surface 415 and an outer surface 416. The inner surface 415 extends around the central axis 101. The lid plate 150 of the process chamber lid 100 is positioned on the sidewall 414. The inner surface 415 of the sidewall 414, the bottom 412 and the process chamber lid 100 defining a processing volume 420.

The process chamber 400 comprises a substrate support pedestal 430 within the processing volume 420. The substrate support pedestal is configured to support a substrate (not shown) during processing. In some embodiments, the substrate support pedestal 430 contains a heater.

In some embodiments, the process chamber 400 comprises a slit valve 440 through the sidewall 414. The slit valve 440 may be useful for transferring wafers into and out of the process chamber 400. In some embodiments, the process chamber 400 comprises a chamber exhaust 450.

Without being bound by theory, it is believed that the slit valve 440 and the chamber exhaust 450 may function to allow heat to escape the process chamber. Accordingly, during processing of a wafer, the wafer may experience a greater loss of temperature near these features of the process chamber 400.

Some embodiments of the disclosure are directed to process chamber lids 100, process chambers 400, and methods of processing using the process chamber lid 100 as described herein. Some embodiments of the disclosure are directed to controllers 350 having one or more configurations to execute individual processes or sub-processes to perform embodiments of the method described herein. The controller 350 can be connected to and configured to operate intermediate components to perform the functions of the methods. For example, the controller 350 of some embodiments is connected to (directly or indirectly) and configured to control one or more of gas valves, actuators, motors, access ports, vacuum control, heaters, etc. Some embodiments are directed to non-transitory computer readable medium configured to execute embodiments of the method.

One or more embodiment of the disclosure is directed towards a processing method. The method begins with heating a substrate with a substrate support heater positioned below the substrate. The method continues by heating at least a portion of a peripheral region of a showerhead positioned above the substrate with at least one of a plurality of individually controlled heater segments on the showerhead. Next, the method minimizing the temperature uniformity of the substrate by controlling the substrate support heater and at least one of the individually controlled heater segments. In some embodiments, the temperature non-uniformity of across the substrate is less than or equal to 3° C. at a set process temperature of 250° C.

In some embodiments, the method further comprises flowing a process gas through the showerhead and over the substrate to form a layer on the substrate. In some embodiments, the layer comprises amorphous silicon.

One or more embodiment of the disclosure is direct towards a method of minimizing substrate heat loss. The method comprises positioning a substrate on a substrate support in a process region opposite a showerhead. The method continues by heating the substrate with a substrate heater within and near a center of the substrate support. The process region is evacuated, lowering the temperature of the substrate in a peripheral region of the substrate. The peripheral region of the substrate is heated by heating the showerhead with a heater in a peripheral region of the showerhead. In some embodiments, the heater comprises a plurality of separate heater segments. In some embodiments, the plurality of separate heater segments are individually controlled to adjust the output of each of the plurality of separate heater segments.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A process chamber lid comprising:

a lid plate comprising a body having an inner wall, an outer wall, a top wall and a bottom wall, the inner wall extending around a central axis spaced a first distance from the central axis forming an open central region, a showerhead positioned within the open central region, the showerhead having a front surface and a back surface defining a thickness with a plurality of apertures extending through the thickness;

a gas funnel positioned above the showerhead, the gas funnel having a front surface, a back surface, an outer wall and an inner wall, the gas funnel having an opening extending through the back surface to the front surface; and a showerhead heater positioned on the back surface of the showerhead and configured to directly heat the showerhead.

2. The process chamber lid of claim 1, wherein the showerhead heater comprises at least one heater segment on the showerhead.

3. The process chamber lid of claim 1, wherein the showerhead heater comprises a plurality of separate heater segment.

4. The process chamber lid of claim 3, wherein the plurality of separate heater segments are evenly spaced around the back surface of the showerhead around the central axis.

5. The process chamber lid of claim 3, wherein each of the plurality of separate heater segments is independently controlled.

6. The process chamber lid of claim 5, further comprising a controller connected to each of the plurality of separate heater segments and configured to adjust an output of each of the plurality of separate heater segments.

7. The process chamber lid of claim 1, wherein the lid plate comprises an outer top wall and an inner top wall, the inner top wall forming an inner ledge having a ledge surface connecting the inner top wall and the outer top wall.

8. The process chamber lid of claim 7, wherein the showerhead has an outer wall, the outer wall comprising a lower outer wall and an upper outer wall, the upper outer wall being further from the central axis than the lower outer wall, the lower outer wall and the upper outer wall connected by a cantilever surface.

9. The process chamber lid of claim 8, wherein the cantilever surface is positioned over the inner ledge of the lid plate.

10. The process chamber lid of claim 9, further comprising a spacer ring having a top surface and a bottom surface, the spacer ring positioned between the cantilever surface of the showerhead and the inner ledge of the lid plate so that the cantilever surface of the showerhead is adjacent the top surface of the spacer ring and the inner ledge of the lid plate is adjacent the bottom surface of the spacer ring.

11. The process chamber lid of claim 10, further comprising: a top surface O-ring between and in contact with the top surface of the spacer ring and the cantilever surface of the showerhead; and a bottom surface O-ring between and in contact with the bottom surface of the spacer ring and the inner ledge of the lid plate.

12. The process chamber lid of claim 1, further comprising a gas inlet line connected to the back surface of the gas funnel and providing fluid communication between a gas source and the opening in the back surface of the gas funnel.

13. A process chamber comprising:

a process chamber lid according to claim 1;

a chamber body comprising a bottom and a sidewall between an inner surface an outer surface, the inner surface extending around the central axis, the lid plate of the process chamber lid positioned on the sidewall, a processing volume defined by the inner surface, the bottom and the process chamber lid; and a substrate support pedestal within the processing volume.

14. The process chamber of claim 13, further comprising a slit valve through the sidewall.

15. The process chamber lid of claim 2, wherein the showerhead heater is configured to reduce temperature non-uniformity across a substrate during a substrate processing method by controlling the at least one heater segment.

* * * * *